(12) United States Patent
Van Den Brink et al.

(10) Patent No.: US 6,556,010 B2
(45) Date of Patent: Apr. 29, 2003

(54) MAGNETIC RESONANCE IMAGING METHOD INVOLVING SUB-SAMPLING

(75) Inventors: Johan Samuel Van Den Brink, Eindhoven (NL); Julius Simon Cohen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 49 days.

(21) Appl. No.: 09/880,209

(22) Filed: Jun. 13, 2001

(65) Prior Publication Data

US 2002/0011845 A1 Jan. 31, 2002

(30) Foreign Application Priority Data

Jun. 15, 2000 (EP) .............................................. 00202082

(51) Int. Cl.[7] .................................................. G01V 3/00
(52) U.S. Cl. ....................................... 324/309; 324/307
(58) Field of Search ................................. 324/309, 307, 324/306, 312, 314, 300

(56) References Cited

U.S. PATENT DOCUMENTS

| | | | | | |
|---|---|---|---|---|---|
| 5,027,070 A | * | 6/1991 | Higuchi | ...................... | 324/309 |
| 5,307,014 A | * | 4/1994 | Laub | .......................... | 324/306 |
| 5,323,113 A | * | 6/1994 | Cory et al. | .................. | 324/307 |

* cited by examiner

*Primary Examiner*—Louis Arana
(74) *Attorney, Agent, or Firm*—John Vodopia

(57) ABSTRACT

A magnetic resonance imaging system is provided with a system of emission antennas,: for example, emission coils, for generating RF excitation pulses. The RF excitation pulses generate magnetic resonance signals from an object to be examined. The system of emission antennas has a spatially inhomogeneous emission profile. The inhomogeneous emission profile is used for the partial spatial encoding of the magnetic resonance signals in addition to the encoding on the basis of magnetic gradient fields. The magnetic resonance image is reconstructed on the basis of the inhomogeneous emission profile

20 Claims, 1 Drawing Sheet

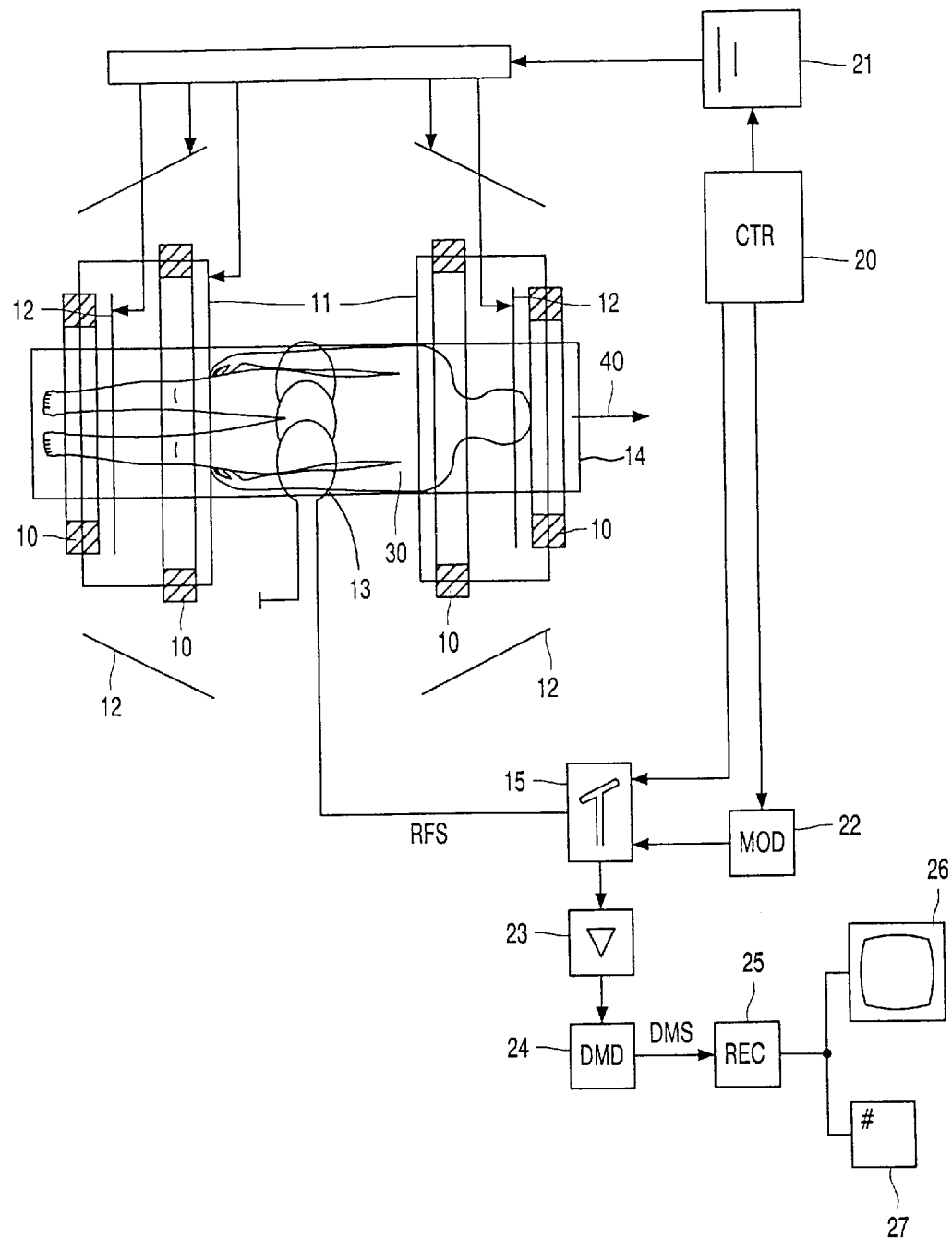

MAGNETIC RESONANCE IMAGING METHOD INVOLVING SUB-SAMPLING

FIELD OF THE INVENTION

The invention relates to a magnetic resonance imaging system including a system of emission antennas for generating one or more RF excitation pulses and a system of receiving antennas for receiving magnetic resonance signals.

BACKGROUND OF THE INVENTION

A magnetic resonance imaging system including a system of emission antennas and a system of receiving antennas is described in U.S. Pat. No. 5,943,433.

This prior art magnetic resonance imaging system includes receiving antennas in the form of surface coils. The spatial receiving profile of the surface coils is inhomogeneous. This means that the sensitivity of the coils for the reception of the magnetic resonance signals differs as a function of the location where the magnetic resonance signals are generated. The magnetic resonance imaging system performs a special correction so as to ensure that the inhomogeneities of the receiving profile do not cause disturbances in the magnetic resonance image formed from the acquired magnetic resonance signals. The correction is performed using a correction algorithm designed to execute the correction with a high calculation speed.

The magnetic resonance imaging system described in U.S. Pat. No. 5,943,433 requires a comparatively long period of time to receive the magnetic resonance signals.

OBJECTS AND SUMMARY OF THE INVENTION

It is an object of the invention to provide a magnetic resonance imaging system which requires a shorter period of time for receiving the magnetic resonance signals.

This object is achieved by means of a magnetic resonance imaging system in accordance with the invention wherein the system of emission antennas has a spatially inhomogeneous emission profile, and the magnetic resonance imaging system is provided with a reconstruction unit for reconstructing a magnetic resonance image from the magnetic resonance signals while utilizing the emission profile of the system of emission antennas.

In light of the spatially inhomogeneous emission profile of the emission antennas, the intensity and/or the phase of the RF excitation pulse in a given position is dependent on the direction and/or the distance from the emission antenna. It has been found in practice that so-called surface coils are very well suitable for generating a spatially inhomogeneous RF excitation pulse. The spatially inhomogeneous RF excitation of magnetic moments, for example, of the nuclear spins, in the object to be examined produces spatially inhomogeneous magnetic resonance signals. This means that the amplitudes and/or the phases of the magnetic resonance signals vary in space, inter alia due to the spatially inhomogeneous pattern of the RF excitation. Such a spatially inhomogeneous pattern of the RF excitation will be referred to hereinafter as the RF excitation profile.

Furthermore, spatial variations of the amplitudes and the phases of the magnetic resonance signals occur as a result of inhomogeneities in the composition and build-up of the object to be examined. Since the inhomogeneous pattern of the RF excitation is known prior to the reception of the magnetic resonance signals, the variations in the magnetic resonance signals resulting from the inhomogeneity of the RF excitation and the variations that relate to the composition and build-up of the object to be examined can be de-interleaved. The magnetic resonance image can be reconstructed from the magnetic resonance signals on the basis of the RF excitation profile. Since little or no spatial encoding of the magnetic resonance signals by temporary gradient fields is required, less time is required for the acquisition of the magnetic resonance signals. Further, since the RF excitation profile partly or completely takes over the encoding by temporary gradient fields, it is possible to acquire magnetic resonance signals for several parts of the k space simultaneously to a high degree of accuracy.

Preferably, the system of emission antennas generates an RF excitation profile such that the magnetic resonance signals are spatially encoded on the basis of the RF excitation profile. For example, the emission antennas are constructed as surface coils for this purpose. Such surface coils can provide a spatial electric current density that is suitable to generate the desired RF excitation profile.

It is noted that the system of emission antennas encompasses a system comprising a single emission antenna, for example a single emission RF-coil having a spatial emission profile. Also a single receiver antenna, such as a surface coil may be employed as the system of receiver antennas.

In a preferred embodiment of the magnetic resonance imaging system in accordance with the invention, the k space is sub-sampled by the magnetic resonance signals. Only a fraction of the data required for the desired spatial resolution and field of view (FOV) is then acquired. For example, only a part of the necessary lines in the k space is sampled during the acquisition of the magnetic resonance signals e.g., only one half, a quarter or a sixteenth part of the lines in the k space is sampled, every second, every fourth or every sixteenth line, respectively, in the k space then being sampled. The spatial encoding required for the reconstruction of the magnetic resonance image is provided by the RF excitation profile so that the magnetic resonance signals can be received simultaneously to a high degree. For example, a plurality of lines in the k space can be sampled simultaneously.

The reconstruction of the magnetic resonance image utilizes the known SENSE or SMASH techniques. The SENSE technique is known per se from, e.g., the article "SENSE: sensitivity encoding for fast MRI" by K. P. Pruesmann et al. in Magnetic Resonance in Medicine 42 (1999) pp. 952–962. The SMASH technique is known per se from, e.g., International Application No. WO 98/21600. The cited publications concerning the SENSE technique and the SMASH technique describe the sub-sampled acquisition of magnetic resonance signals and the formation of the magnetic resonance image on the basis of the coil sensitivity profiles of the surface coils used as receiving antennas. The conventional SENSE technique and the conventional SMASH technique utilize a spatially uniform RF excitation profile.

The reconstruction unit in a preferred embodiment of the magnetic resonance imaging system in accordance with the invention is arranged to reconstruct one or more emission coil images. Such emission coil images are derived from sub-sampled signal sections of magnetic resonance signals. The spatially inhomogeneous RF excitations of individual emission antennas generate the respective signal sections of magnetic resonance signals. The sub-sampling of the signal sections causes so-called aliasing artefacts in the emission coil images. Such aliasing artefacts arise because the field of view in the emission coil image is too small relative to the region from which the signal section originates. It has been found that the SENSE technique enables practically complete or almost complete elimination of the aliasing artefacts in the emission coil images on the basis of the emission profile. A magnetic resonance image of high diagnostic quality can thus be derived from the sub-sampled signal sections.

The magnetic resonance image typically has a spatial resolution which is higher than that of the individual signal sections. Since the signal sections are sub-sampled, that is, the signal sections sample, for example, only every second, fourth or sixteenth line in the k space, the acquisition of the signal sections requires only a small amount of time. It has been found that fast motions in the object to be examined can be reliably tracked. For example, a heart beating at a rate of 150–200/min can be suitably tracked.

In a further embodiment of the magnetic resonance imaging system in accordance with the invention, the sub-sampled magnetic resonance signals are combined on the basis of the emission profile so as to form combination signals. The combination signals have full sampling considering the resolution of the magnetic resonance image. The magnetic resonance image is subsequently reconstructed from the combination signals by means of a technique that is known per se, for example by 2D Fourier transformation.

For example, the spatial distribution of the electric current density through the emission coils is controlled such that the system of emission coils has a spatially sinusoidal profile. Individual so-called spatial harmonic components can thus be excited by the system of emission coils. This means that the RF excitation generated by such a system of emission coils leads to the reception of signal sections of magnetic resonance signals which always relate to a spatial harmonic relating to spatial variations in the object to be examined with a wavelength within a narrow range. The conventional SMASH technique can be applied to such signal sections in order to reconstruct therefrom the magnetic resonance image while utilizing the applied emission profile.

In a further preferred embodiment of the magnetic resonance imaging system in accordance with the invention, the reconstruction of the magnetic resonance image from the magnetic resonance signals also utilizes the receiving profiles of the receiving antennas. An even higher degree of sub-sampling can thus be used. Such a high degree of sub-sampling is achieved by applying sub-sampling during the excitation as well as during the acquisition of the magnetic resonance signals. Both the emission profiles and the receiving profiles provide a part of the spatial encoding of the magnetic resonance signals, so that the spatial encoding by gradient fields is substantially reduced. As a result, it is sufficient to sample the k space with a very low density. In that cases magnetic resonance signals are required, for example, for very few lines at a rather large distance from one another in the k space. Magnetic resonance signals can thus be acquired with a very simple, brief RF excitation and gradient pulse sequences wherefrom a magnetic resonance image having a high spatial resolution and a high contrast resolution is reconstructed nevertheless. For example, emission/receiving coil images can be reconstructed from respective signal sections of magnetic resonance signals that have been generated by means of respective emission coils and received by means of respective receiving coils.

In view of the high degree of sub-sampling of the signal sections, so-called aliasing artefacts occur to a high degree in the emission/receiving coil images. These artefacts are caused by the fact that individual pixels in the emission/receiving coil images contain contributions from different positions in the object to be examined. Utilizing the emission profiles of the emission coils and the receiving profiles of the receiving antenna, the magnetic resonance image can be derived from the emission/receiving coil images while decomposing the pixels of the emission/receiving coil images into the contributions from different positions within the object. Such decomposition can be performed, for example by means of the SENSE method that is known per se.

It is also possible to perform an interpolation in the k space from the signal sections of sub-sampled magnetic resonance signals generated by the RF excitations by respective emission coils and acquired by means of respective receiving coils, that is, an interpolation on the basis of weighting factors, so as to execute full sampling of (a part of) the k space. The weighting factors in the interpolation are dependent on the emission profiles and the receiving profiles.

These and other aspects of the invention will be described in detail hereinafter, by way of example, on the basis of the following embodiments and with reference to the accompanying drawing.

BRIEF DESCRIPTION OF THE DRAWINGS

The sole FIGURE shows diagrammatically a magnetic resonance imaging system in which the invention is used.

DETAILED DESCRIPTION OF THE INVENTION

The magnetic resonance imaging system includes a system of main coils 10 for generating a steady, homogeneous magnetic field. The main coils 10 are constructed, for example. such that they enclose a tunnel-shaped examination space. A patient 30 to be examined is positioned in the tunnel-shaped examination space enclosed by the main coils 10.

The magnetic resonance imaging system also includes a number of gradient coils 11, 12 whereby magnetic fields with spatial variations, typically in the form of temporary gradients in individual directions, are superposed on the homogeneous magnetic field. The gradient coils 11, 12 are connected to a variable power supply unit 21. The gradient coils 11, 12 are energized by applying an electric current thereto by means of the power supply unit 21. The strength, direction and duration of the temporary gradients are controlled by control of the power supply unit 21 via a control unit 20.

The magnetic resonance imaging system also includes emission and receiving coils 13 for generating the RF excitation pulses and for receiving the magnetic resonance signals. The emission coil 13 is constructed, for example as a system of surface coils 13 having an excitation profile with spatial variations. The system of surface coils 13 is usually arranged within the magnetic resonance imaging system such that the part of the patient 30 that is to be examined and introduced into the magnetic resonance imaging system is situated within the excitation profile of the system of surface coils 13. The system of surface coils 13 acts as an emission antenna for the emission of the RF excitation pulses and RF refocusing pulses. The system of surface coils 13 preferably has a spatially inhomogeneous intensity distribution of the emitted RF pulses. The same coil or antenna can be used alternately as an emission coil and as a receiving coil.

Furthermore, the emission and receiving coil 13 is usually shaped as a coil, but other geometries where the emission and receiving coil 13 acts as an emission and receiving antenna for RF electromagnetic signals are also feasible. The emission and receiving coil 13 is connected to an electronic emission/receiving circuit 15. The electronic emission/receiving circuit 15 supplies the emission and receiving coils 13 with the RF signals (RFS) such as RF excitation pulses and possibly refocusing pulses. The magnetic resonance signals received by the system of surface coils 13 are applied to the emission and receiving circuit 15.

It is to be noted that individual separate receiving coils can also be used. For example, surface coils can be used as receiving coils. Such surface coils have a high sensitivity in a comparatively small volume. The emission coils, such as the surface coils, are connected to a demodulator 24 and the magnetic resonance signals (RFS) received are demodulated by the demodulator 24. The demodulated magnetic resonance signals (DMS) are applied to a reconstruction unit 25. The receiving coil is connected to a preamplifier 23. The preamplifier 23 amplifies the RF resonance signal (RFS) received by the receiving coil and the amplified RF resonance signal is applied to the demodulator 24. The demodulator 24 demodulates the amplified RF resonance signal. The demodulated resonance signal contains the actual information concerning the local spin densities in the part of the object to be imaged.

Furthermore, the emission and receiving circuit 15 is connected to a modulator 22. The modulator 22 and the emission and receiving circuit 15 activate the emission coil 13 so as to emit the RF excitation pulses and refocusing pulses. The reconstruction unit 25 derives one or more image signals representing the image information of the imaged part of the object to be examined from the demodulated magnetic resonance signals (DMS) and while utilizing the emission profiles of the surface coils 13.

The reconstruction unit 25 in practice is preferably constructed as a digital image processing unit 25 which is programmed so as to reconstruct the image signals from the demodulated magnetic resonance signals while utilizing the emission profiles, the image signals representing the image information of the part of the object to be imaged. The emission profiles are derived, for example by performing calibration measurements on a homogeneous object and are stored in a working memory of the image processing unit (i.e., the reconstruction unit 25). The emission profiles stored are preferably updated at regular intervals in order to take into account deformation of the surface coils 13. To this end, it is advantageous to update the emission profiles each time the surface coils are arranged on the patient to be examined.

The signal present at the output of the reconstruction unit 25 is applied to a monitor 26 so that the magnetic resonance image can be displayed on the monitor 26.

It is alternatively possible to store the signal from the reconstruction unit 25 in a buffer unit 27 while awaiting further processing.

What is claimed is:

1. A magnetic resonance imaging system, comprising:
   a system of emission antennas for generating one or more RF excitation pulses, said system of emission antennas having a spatially inhomogeneous emission profile,
   a system of receiving antennas for receiving magnetic resonance signals, and
   a reconstruction unit coupled to said system of receiving antennas and arranged to reconstruct a magnetic resonance image from the magnetic resonance signals received by said system of receiving antennas, said reconstruction unit being arranged to remove the effect of the spatially inhomogeneous emission profile of said system of emission antennas on the magnetic resonance signals.

2. A magnetic resonance imaging system as claimed in claim 1, wherein said reconstruction unit is arranged to realize spatial encoding of the magnetic resonance signals on the basis of the spatial emission profile.

3. A magnetic resonance imaging system as claimed in claim 2, wherein said reconstruction unit is arranged to combine the received magnetic-resonance signals generated in response to the RF excitation pulse from said emission antennas to form-combination signals and to derive the magnetic resonance image from the combination signals.

4. A magnetic resonance imaging system as claimed in claim 2, wherein the spatial emission profile has the property that the one or more RF excitation pulses generate magnetic resonance signals whereby the k space is sub-sampled.

5. A magnetic resonance imaging system as claimed in claim 4, wherein the spatial emission profile has the property that a sub-sampled number of lines is sampled in the k space by acquisition of the magnetic resonance signals generated in response to the RF excitation pulses.

6. A magnetic resonance imaging system as claimed in claim 1, wherein said reconstruction unit is arranged to reconstruct one or more emission coil images from respective signal sections of the magnetic resonance signals, the individual signal sections containing magnetic resonance signals generated in response to RF excitations by individual emission antennas, and said reconstruction unit is further arranged to derive the magnetic resonance image from the emission coil images and the spatial emission profile.

7. A magnetic resonance imaging system as claimed in claim 1, wherein said receiving antennas have a spatial receiving profile and said reconstruction unit is arranged to reconstruct the magnetic resonance image at least partly on the basis of the receiving profile of said receiving antennas.

8. A magnetic resonance imaging system as claimed in claim 1, wherein said system of emission antennas comprises at least one surface coil.

9. A magnetic resonance imaging system as claimed in claim 1, wherein said system of emission antennas comprises a plurality of surface coils.

10. A magnetic resonance imaging system as claimed in claim 1, wherein said system of emission antennas comprises a plurality of emission antennas.

11. A magnetic resonance imaging-system as claimed in claim 1, wherein said reconstruction unit is arranged to realize spatial encoding of the magnetic resonance signals solely on the basis of the spatial emission profile of said plurality of emission antennas.

12. A magnetic resonance imaging system as claimed in claim 1, wherein said system of emission antennas is arranged such that the spatially inhomogeneous emission profile produces spatially inhomogeneous magnetic resonance signals in which at least one of the amplitude and phase of the magnetic resonance signals vary in space.

13. A magnetic resonance imaging system, comprising:
   a plurality of emission antennas for generating one or more RF excitation pulses, said plurality of emission antennas having a spatially inhomogeneous emission profile,
   a system of receiving antennas for receiving magnetic resonance signals, and
   a reconstruction unit coupled to said system of receiving antennas for reconstructing a magnetic resonance image from the magnetic resonance signals received by said system of receiving antennas in consideration of the spatially inhomogeneous emission profile of said emission antennas.

14. A magnetic resonance imaging system as claimed in claim 13, wherein said reconstruction unit is arranged to remove the effect of the spatially inhomogeneous emission profile of said plurality of emission antennas on the magnetic resonance signals.

15. A method for performing magnetic resonance imaging, comprising:

generating a steady homogenous magnetic field by means of a system of main coils;

generating one or more RF excitation pulses in the examination space by means of a system of emission antennas such that the emission antennas provide a spatially inhomogeneous emission profile;

receiving magnetic resonance signals by means of a system of receiving antennas; and reconstructing a magnetic resonance image from the received magnetic resonance signals by removing the effect of the spatially inhomogeneous emission profile of the system of emission antennas on the magnetic resonance signals.

16. A method as claimed in claim 15, wherein the system of emission antennas comprises at least one surface coil.

17. A method as claimed in claim 15, further comprising spatial encoding the magnetic resonance signals solely on the basis of the emission profile of the emission antennas and not on the basis of temporary gradient fields.

18. A method as claimed in claim 15, further comprising sub-sampling the k space by sampling a number of lines in the k space by acquiring magnetic resonance signals generated in response to the RF excitation pulses.

19. A method as claimed in claim 15, further comprising deriving the spatially inhomogeneous emission profile of the emission antennas by generating one or more RF excitation pulses for a homogeneous object and storing the received magnetic resonance signals.

20. A method as claimed in claim 15, wherein the system of emission antennas comprises a plurality of emission antennas.

* * * * *